United States Patent

Moyer et al.

[11] 4,330,614
[45] May 18, 1982

[54] PROCESS FOR FORMING A PATTERNED RESIST MASK

[75] Inventors: William A. Moyer; Robert L. Wood, both of Wappingers Falls, N.Y.

[73] Assignee: International Business Machines Corporation, Armonk, N.Y.

[21] Appl. No.: 196,944

[22] Filed: Oct. 14, 1980

[51] Int. Cl.³ .............................................. G03C 5/00
[52] U.S. Cl. .................................. 430/325; 430/296; 430/311; 430/313; 430/331
[58] Field of Search ............... 430/325, 331, 296, 313, 430/314, 315, 311

[56] References Cited

U.S. PATENT DOCUMENTS 3,475,171 10/1969 Alles .................................... 430/331
3,987,215 10/1976 Cortellino .......................... 430/331
4,130,425 12/1978 Boyd .................................. 430/331

Primary Examiner—Jack P. Brammer
Attorney, Agent, or Firm—Henry Powers

[57] ABSTRACT

The performance of ethylene glycol alkylether developers, for positive methacrylate-methacrylic acid copolymer and terpolymer resists, is controlled by adding an organic complexing agent, such as citric acid, or a combination of a transition metal salt and a complexing agent, such as ammonium citrate, to the developer. The additives provide a consistent development rate, so that the maximum difference between the dissolution rates of the exposed and unexposed portions of the resist layer can be maintained, regardless of the developer purity.

2 Claims, 1 Drawing Figure

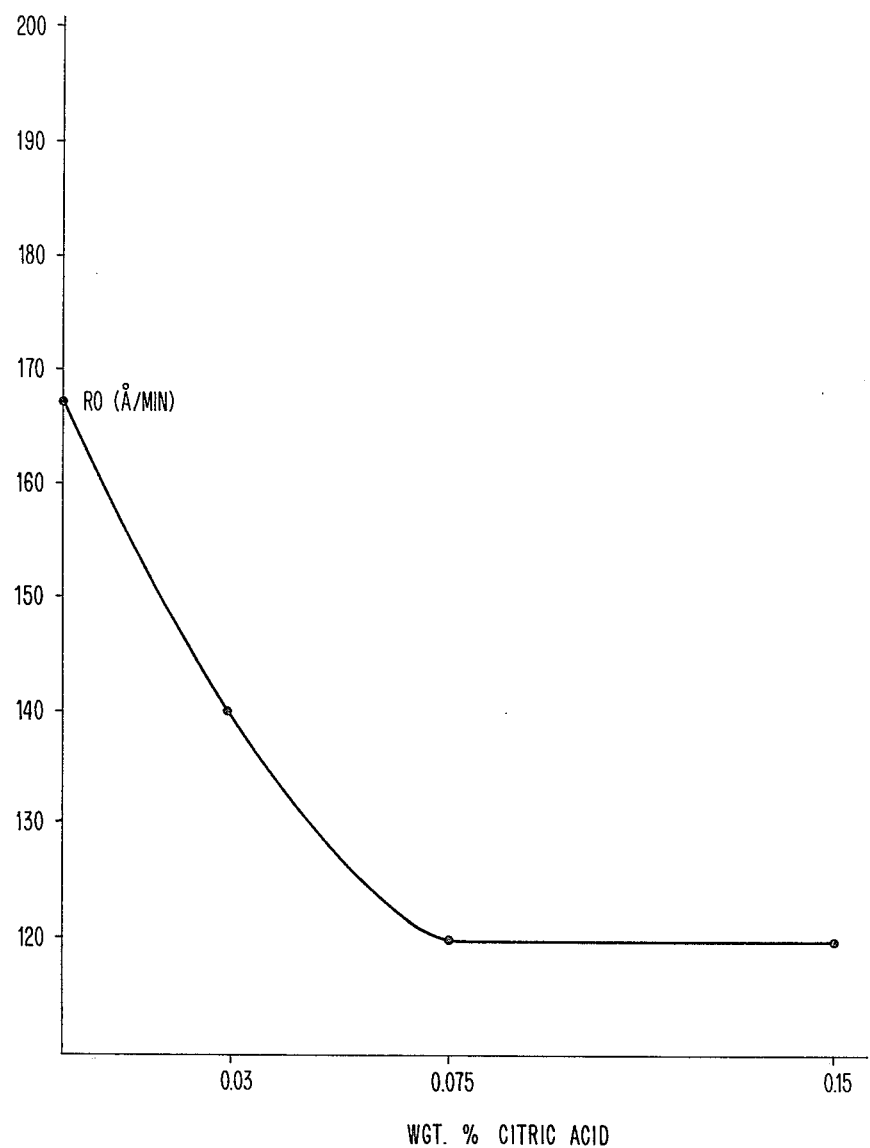

PROCESS FOR FORMING A PATTERNED RESIST MASK

DESCRIPTION

BACKGROUND OF THE INVENTION

This invention relates generally to the formation of positive resist masks using high energy radiation, and more particularly to the solvent development of electron irradiated acrylate polymer resist layers.

The formation of positive resist masks from layers of radiation degradable acrylate polymers is described, for example, by Haller and Hatzakis in U.S. Pat. No. 3,535,137 and by Hatzakis in U.S. Pat. No. 4,087,569. A radiation degradable polymer layer is coated on a substrate and is subjected to patternwise exposure by high energy radiation such as, for example, x-rays, nuclear radiation, and electrons. The irradiated regions of the polymer suffer a decrease in molecular weight and, therefore, become more rapidly soluble. A developer is then used to preferentially remove the irradiated portions of the layer. The substrate is then subjected to an additive or subtractive process, such as metallization or etching, with the remaining portions of the resist layer acting to protect the substrate.

It is possible to employ developers which attack only the radiation exposed portions of the resist layer, and which leave the unexposed portions almost intact. However, it has been found that higher process speeds can be obtained if a solvent is employed which attacks both the exposed and unexposed portions of the resist layer, but which attacks the exposed portion at a higher rate. In order to further speed up the resist mask formation process, developing techniques which speed the development of the exposed portions of the resist, particularly when using higher molecular weight materials, are desirable. One such technique is described in U.S. Pat. No. 4,078,098, where water is added to ketone developers.

It has been observed that different lots of an organic solvent developer often dissolve the resist polymer at much different rates, which makes it difficult to obtain consistently satisfactory resist layer development.

This problem can also result from contamination of the developer during use. For example, the ethylene glycol monoethylether (2-ethoxyethanol) and water developers, which are described in the IBM Technical Disclosure Bulletin article, "Noncracking Developers" by Cortellino, Vol. 19, No. 4, page 1216, September 1976, give dissolution rates which can vary by over 200 Å per minute.

BRIEF SUMMARY OF THE INVENTION

We have now discovered that trace impurities are the cause of the problem of inconsistent resist dissolution rates. These impurities are believed to be transition metal ions. The impurities are present in only a few parts per million and cannot be uniformly removed by normal techniques such as distillation or charcoal treatments.

In accordance with this invention, there is provided an improved process for forming a patterned resist mask.

A methacrylate polymer containing resist layer is coated on a substrate and exposed to radiation in a predetermined pattern. The exposed portions of the pattern are removed with an organic solvent which contains an organic complexing agent. If the complexing agent contains free carboxylic acid groups, then an organic base can be added to control the pH. Alternatively, a complex of a transition metal salt and an organic complexing agent can be added in order to provide a particular, preselected development rate.

DESCRIPTION OF THE DRAWING

The FIGURE is a graph illustrating the effect of the concentration of organic complexing agent on resist polymer dissolution rate.

DETAILED DESCRIPTION

Methacrylate polymers have been used as highly radiation sensitive, positive acting resist materials for microlithographic applications, such as integrated circuit or magnetic bubble device manufacture. The polymers can be exposed at relatively small radiation dosages, which makes them particularly suitable with exposure systems using scanning electron beams, such as are described, for example in U.S. Pat. No. 3,535,137 at charge densities as low as $2 \times 10^{-6}$ coul/cm$^2$. Such polymers are derived from lower alkyl (1-4 carbon atoms) esters of methacrylic acid and include copolymers with methacrylic acid and terpolymers including methacrylic anhydride groups. Specific examples of such polymers are given in U.S. Pat. Nos. 3,779,806; 3,984,572; 3,996,393; 4,011,351; 4,087,569 and 4,096,290 as well as 3,535,137. The polymers ae dissolved in a suitable solvent and coated, such as by dip or spin coating, onto a substrate. The coated film is baked and then patternwise exposed with radiation to degrade the polymer in the exposed areas. The exposed areas are then removed by contacting the film with a solvent developer which preferentially removes the degraded polymer portions to form a relief image on the substrate. In order to obtain a suitable developed image in the least amount of processing time, a developer is chosen which attacks both the exposed and unexposed polymer to quickly remove the exposed portions with a minimum of loss of unexposed polymer. A high ratio (R/Ro) of the rate of removal of the exposed polymer (R) to the rate of removal of the unexposed polymer (Ro) is desired (This ratio has also been termed S/So.). The ratio should also be consistent, so that the process is reproducible, particularly in a manufacturing environment. Suitable developers are organic liquids such as alcohols, ketones, esters and ethers.

It has been found advantageous to add small amounts (about 1–10% by weight) of water to the developers to increase the developer speed and/or eliminate cracking of the resist layers. Specific examples of suitable solvents include; methyl ethyl ketone, methyl isobutyl ketone, methanol, and mono and dialkyl ethers of diethylene glycol and ethylene glycol and derivatives thereof, where the alkyl group contains about 1–6 carbon atoms, such as ethylene glycol monoethyl ether, diethylene glycol dimethyl ether and ethylene glycol monoethyl ether acetate. These ethers are commercially available under the tradenames Cellosolve and Carbitol (Union Carbide). It has been observed that different lots and/or sources of solvent can give different dissolution rates. For example, rates, Ro, for unexposed methyl methacrylate/methacrylic acid/methacrylic anhydride terpolymer can vary from 0 (non-development) to over 200 angstroms per minute, when using ethylene glycol monoethylether (2-ethoxyethanol) developer. Predictable rates, of between about 100 to 180 angstroms per minute are required for optimum results. At rates of Ro below about 100 angstroms per minute, the R exposed dissolution rate is so low that not only are development times excessive but the polymer swells and distorts the image. Also, redeposition of polymer in the image areas can occur. At rates of Ro above 180 angstroms per minute, excessive resist thickness loss can occur as well as a low R/Ro ratio. In other words, not only are contaminated developers a problem, but developers of high purity may give rates which are above a desired maximum value. The optimum rate range will vary depending upon the particular resist material employed and the polymer prebaking conditions of time and temperature.

We have discovered that low dissolution rates are due to trace impurities in the solvent. These trace impurities are not completely or uniformly removed by distillation or charcoal treatments. For example, developers treated by distillation have Ro's which can range from 120 to 230 Å per minute for terpolymer prebake conditions of 175° C. for 45 minutes. We believe that the active impurities are trace metals, and particularly transition metals, because we have found that the addition of salts of transition metals in amounts of about 0.01% weight/volume inhibit purified developers. The addition of alkaline earth or alkali metal salts have no noticeable effect on development rates at amounts of 0.01% weight/volume. Accordingly, we have found that by adding organic complexing agents for transition metals to the developer, the developer inhibiting effect of trace impurities is removed and a consistent development rate within the desired range for maximizing the R/Ro ratio is provided and maintained.

We have also found that a combination of complexing agent such as ammonium citrate dibasic and transition metal salt can be added to provide a tailored development rate. Examples of transition metals which affect dissolution rates include manganese, iron, cobalt, nickel, copper, zinc, titanium, vanadium, chromium, zirconium, niobium, molybdenum, ruthenium, rhodium, palladium, silver and cadmium. Specific examples of salts are $CuCl_2$, $Ni(ClO_4)_2$, $CoSO_4$, $FeCl_3$, $MnSO_4$, and $ZnCl_2$. Amounts of complexing agent and transition metal salt are chosen to give between about 1–2 ppm of free metal ion. This provides a controlled, small concentration of free transition metal ion in the developer which could not be achieved simply by attempting to add and maintain the correct trace amounts of transition metal ion. The complexes have a tendency to precipitate due to the limited solubility in the developers. It is preferred, therefore, to use organic ionic complexing agents alone, which we have found retard the development rate to some extent and, therefore, can provide by themselves a tailored development rate within a desired range. They also prevent the development rate inhibiting effects of trace amounts of transition metal contaminants which may be originally present in the developer or which are introduced during use.

Suitable organic complexing agents for the practice of the invention include polycarboxylic acids, hydroxy di- and tri-carboxylic acids, aliphatic and aromatic amino carboxylic acids, $\alpha,\beta$-diketones, esters, and aromatic sulfonic acids. Specific examples include, oxalic acid, succinic acid, tartaric acid, citric acid, ethylene diamine tetraacetic acid (EDTA), pyridine-2-carboxylic acid, acetyl acetone, and 4,5-dihydroxybenzene-1,3-disulfonic acid.

Amounts of organic complexing agent which are effective to provide the desired Ro rates are in an order of magnitude of about 0.1 weight percent based on the amount of solvent. The optimum amount will vary, depending upon the particular resist polymer employed. As illustrated in FIG. 1, citric acid in ethylene glycol monoethyl ether with a methyl methacrylate/methacrylic acid/methacrylic anhydride terpolymer layer coated on a substrate provides a constant terpolymer dissolution rate, Ro, when present in an amount of about 0.075% by weight. At amounts of less than about 0.075%, Ro is very sensitive to small changes in citric acid concentration. At amounts from 0.075% to about 0.15%, Ro remains constant, and there is no particular advantage in adding more, although an excess would not be harmful as Ro would be expected to remain about the same. At amounts of about 0.15% by weight one can be sure of being on the flat part of the curve with this combination of resist and developer.

Where free carboxylic acid groups are present in the complexing agent, any undesirable effects of an acid solution, such as container leaching or resist layer whitening, are avoided by adding a non-volatile, solvent soluble amine having a pKa value between about 7.8 and 9.5 inclusive, for example amines having the general formula $H_nN(CH_2CH_2OH)_m$; where n=0 to 2 and m=1 to 3. A preferred additive is triethanol amine. The amines are selected to have no significant effect on Ro and are added in amounts to provide a neutral pH.

As previously mentioned, from about 1–10 percent by weight of water is added to the developer to prevent cracking of the resist layers. A convenient method of adding solid additive materials to the solvent developer is to dissolve them in water, and then add the resulting aqueous solution to the developer.

EXAMPLE 1

The improvement in R/Ro ratio obtained by the invention is illustrated by comparing resist layers which are developed after electron beam patternwise exposure with either untreated developer or developer containing an organic complexing agent.

Silicon wafers, $2\frac{1}{4}$ inches in diameter, are coated with a 1.4 μm thick layer of methyl methacrylate/methacrylic acid/methacrylic anhydride terpolymer resist. The resist is prepared by the process described in U.S. Pat. No. 4,087,569. The resist layer is formed by flooding the wafer with the liquid resist solution and spinning the wafer, on a headway spin coater, at 2000±200 rpm for 1.0±0.1 minute. The wafers are baked in a "Blue M" convection oven, containing an aluminum plate $\frac{1}{2}$ inches thick for thermal mass, at either 170° C.±2° C. or 175°±2° C. for 45±2 minutes. Resist thickness is measured with either a talystep (scale setting 3) or a film thickness analyzer. The resist is patternwise exposed with a scanning electron beam exposure system at 10 $\mu C/cm^2$. The wafers are quartered, and each quarter is developed in the developer to be tested, which is controlled by a thermostat to a temperature of 21.3°±0.1° C. The development time for each quarter wafer is chosen such that a range of develop times is generated which brackets the expected time. Each quarter is visually inspected using a microscope to determine the minimum develop time which produces cleared images. This time is divided into the initial film thickness to calculate the R value. The remaining film thickness is measured in an unexposed area, and this value is subtracted from the initial film thickness to obtain the unexposed film thickness loss. Film thickness loss is divided by develop time to calculate Ro. The R value is divided by Ro to express the rate ratio. The results of this procedure are given in Table I below. The untreated developer was technical grade 2-ethoxyethanol which had been distilled by simple distillation. The treated developer was the distilled 2-ethoxyethanol to which was added an aqueous solution containing 5% weight-/volume of anhydrous citric acid and 12% weight-/volume of triethanolamine in an amount of 3 parts by weight of treatment solution to 97 parts by weight of developer. As shown in the table, the rate ratios increased significantly at either the 170° or 175° C. prebake condition, when the treated developer was used. It was found that the 175° C. necessitated a somewhat longer development time when using the treated developer, although good image clean-out was possible. However, more desirable, shorter development times were obtained using the 170° C. prebake. The concentration of citric acid in the developer is 0.15% on a weight/weight basis which is an amount sufficient to make the Ro value insensitive to deviations in citrate content which might arise from weighing errors. It also provides sufficient excess citric acid to eliminate the effects of any metal contamination during use. The amine is added in a threefold molar proportion to provide a pH of about 7.0.

TABLE I

| | Rate Ratio Data | |
| --- | --- | --- |
| Developer | R/Ro 175° C. Prebake | R/Ro 170° C. Prebake |
| Untreated | $\frac{1224}{180} = 6.8$ | $\frac{1270}{230} = 5.5$ |
| Treated | $\frac{1070}{130} = 8.2$ | $\frac{1208}{160} = 7.6$ |

EXAMPLE 2

The treatment reproducibility was investigated by treating raw 2-ethoxyethanol samples from seven sources and using the treated and untreated samples to dissolve the terpolymer layers of Example 1 which had been prebaked at 175° C. for 45 minutes. The treated samples contained the same concentration of citric acid and triethanolamine as in Example 1. The results are given in Table II below.

TABLE II

| Treatment Reproducibility | | |
| --- | --- | --- |
| Sample No. | $R_o$ Untreated | $R_o$ Treated |
| 1 | 220 Å/min. | 126 Å/min. |
| 2 | 116 | 120 |
| 3 | 126 | 123 |
| 4 | 160 | 140 |
| 5 | 200 | 123 |
| 6 | 200 | 135 |
| 7 | 190 | 118 |

It will be noted that for untreated developers, Ro varies over a range of more than 100 A/min., while the treated developers have a range of only 22 A/min. It is also evident that the mean Ro value of untreated developer is substantially higher than that of treated developer (173 vs 126).

EXAMPLE 3

The developer stabilization was investigated by spiking three treated and untreated developers from different sources with one part per million of iron and monitoring the effect of this addition on Ro of the terpolymer used in Example 1 which is prebaked at 175° C. for 45 minutes. The treated samples contained the same concentration of citric acid (CA) and triethanol amine (TEA) as in Example 1. Table III lists the Ro values obtained before and after the iron addition to three treated and three untreated developers. It will be observed in all cases that iron inhibits dissolution in untreated developers, while treated developers are not affected. It is therefore evident that developer stabilization against iron was achieved, which can be expected in the case of all cations known to complex with citric acid.

TABLE III

| | Developer Stabilization | | | |
| --- | --- | --- | --- | --- |
| | No Treatment | | After CA/TEA Treatment | |
| Sample No. | Ro(Å/min) | Ro With 1 ppm Fe | Ro(Å/min) | Ro With 1 ppm Fe |
| 1 | 220 | 100 | 126 | 120 |
| 2 | 166 | <50 | 120 | 120 |
| 3 | 126 | 87 | 114 | 123 |

EXAMPLE 4

Raw 2-ethoxyethanol samples, containing 3% by weight of water based on the weight of solvent, and which have Ro's for dissolving a methyl methacrylate/-methacrylic acid/methacrylic anhydride terpolymer resist layer ranging from 0-200 Å/min, are purified by charcoal treatment, ion exchange or distillation. The samples then have Ro's which are in excess of 200 Å/min. In order to provide a controlled development rate the purified samples are treated with a solution which contains a metal-citrate complex. The complex is formed by preparing an aqueous solution containing by weight 10% ammonium citrate dibasic, 2% $ZnCl_2$ and 1% $CaCl_2$ and filtering out the precipitate which is formed. The precipitate is a combination of excess ammonium citrate and metal-citrate complex. The zinc and citrate that remain soluble in the filtrate establish an equilibrium allowing a sufficient concentration of free zinc ions to partially inhibit the terpolymer dissolution and yield, when this solution is added to the developers, Ro rates in a desirable range of about 160 Å/min. The excess of citrate with respect to zinc provides a buffering effect which hinders the influence of further metallic additions which may occur by contamination during the life of the developer.

Table IV illustrates the effect on Ro of adding ammonium citrate to three developers and three non-developers. The addition has the effect of restoring the Ro of non-developers while the Ro of finite developers remained unchanged.

TABLE IV

| | Solubility Rate, Ro, Å/min | |
| --- | --- | --- |
| 2-Ethoxyethanols of Different Origin + 3% Water | Untreated | With 0.1 Wt % Ammonium Citrate Dibasic Added |
| 1 | 146 | 146 |
| 2 | 0 | 180 |
| 3 | 193 | 190 |
| 4 | 0 | 186 |
| 5 | 0 | 180 |
| 6 | 200 | 206 |

Besides the citric acid and ammonium citrate, acetylacetone, EDTA, oxalic and tartaric acids when added in amounts of about 1% w/v or less to solvent developers give similar results in restoring the non-developers to a finite development rate.

We claim:

1. In a process for forming a patterned resist mask, in which a methacrylate polymer layer is formed on a substrate, patternwise exposed to radiation, and then contacted with an organic solvent developer to remove the exposed portions of the layer, the improvement which comprises, adding to said developer an organic complexing agent, wherein a transition metal ion is added in order to provide a tailored development rate.

2. In a process for forming a patterned resist mask, in which a methacrylate polymer layer is formed on a substrate, patternwise exposed to radiation, and then contacted with an organic solvent developer to remove the exposed portions of the layer, the improvement which comprises, adding to said developer an organic complexing agent, wherein the polymer is a methyl methacrylate/methacrylic acid/methacrylic anhydride terpolymer, the developer is 2-ethoxyethanol, the complexing agent is citric acid and the amine is triethanol amine.

* * * * *